US011663776B2

(12) United States Patent
Mishra et al.

(10) Patent No.: US 11,663,776 B2
(45) Date of Patent: *May 30, 2023

(54) GENERATING AND VALIDATING A VIRTUAL 3D REPRESENTATION OF A REAL-WORLD STRUCTURE

(71) Applicant: Hover Inc., San Francisco, CA (US)

(72) Inventors: Ajay Mishra, Palo Alto, CA (US); Manish Upendran, San Francisco, CA (US); A. J. Altman, San Francisco, CA (US); William Castillo, San Carlos, CA (US)

(73) Assignee: HOVER Inc., San Francisco, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/379,254

(22) Filed: Jul. 19, 2021

(65) Prior Publication Data

US 2021/0350617 A1 Nov. 11, 2021

Related U.S. Application Data

(63) Continuation of application No. 16/220,900, filed on Dec. 14, 2018, now Pat. No. 11,100,704.

(51) Int. Cl.
| | | |
|---|---|---|
| G06T 17/05 | (2011.01) | |
| G06T 7/55 | (2017.01) | |
| G06T 17/00 | (2006.01) | |
| G06F 30/13 | (2020.01) | |
| G06T 7/00 | (2017.01) | |
| G06T 15/20 | (2011.01) | |

(52) U.S. Cl.
CPC ............. *G06T 17/05* (2013.01); *G06F 30/13* (2020.01); *G06T 7/55* (2017.01); *G06T 7/97* (2017.01); *G06T 17/00* (2013.01); *G06T 15/205* (2013.01)

(58) Field of Classification Search
CPC ................................ G06T 7/593; G06T 7/596
See application file for complete search history.

(56) References Cited

U.S. PATENT DOCUMENTS

| | | |
|---|---|---|
| 5,621,807 A | 4/1997 | Eibert |
| 8,447,098 B1 | 5/2013 | Cohen et al. |
| 11,423,615 B1 | 8/2022 | Villalon |
| 2003/0014224 A1 | 1/2003 | Guo et al. |

(Continued)

FOREIGN PATENT DOCUMENTS

WO WO 2014/014524 A1 1/2014

OTHER PUBLICATIONS

The International Searching Authority, "Search Report" in application No. PCT/US19/63092, dated Feb. 19, 2020, 16 pages.

(Continued)

*Primary Examiner* — Ryan McCulley
(74) *Attorney, Agent, or Firm* — Knobbe, Martens, Olson & Bear, LLP

(57) ABSTRACT

A computer system maintains structure data indicating geometrical constraints for each structure category of a plurality of structure categories. The computer system generates a virtual 3D representation of a structure based on a set of images depicting the structure. For each image in the set of images, one or more landmarks are identified. Based on the landmarks, a candidate structure category is selected. The virtual 3D representation is generated based on the geometrical constraints of the candidate structure category and the landmarks identified in the set of images.

23 Claims, 6 Drawing Sheets

(56) References Cited

U.S. PATENT DOCUMENTS

| | | |
|---|---|---|
| 2005/0135670 A1 | 6/2005 | Vaidyanathan |
| 2009/0009513 A1 | 1/2009 | Van Den Hengel et al. |
| 2009/0070077 A1 | 3/2009 | Tian et al. |
| 2012/0041722 A1 | 2/2012 | Quan et al. |
| 2013/0113797 A1 | 5/2013 | Mitrakis et al. |
| 2013/0182902 A1 | 7/2013 | Holz |
| 2014/0133741 A1 | 5/2014 | Wang |
| 2014/0168215 A1 | 6/2014 | Cohen et al. |
| 2015/0009214 A1 | 1/2015 | Lee et al. |
| 2015/0172628 A1 | 6/2015 | Brown et al. |
| 2015/0381968 A1 | 12/2015 | Arora et al. |
| 2016/0125270 A1 | 5/2016 | Gokturk et al. |
| 2018/0053347 A1 | 2/2018 | Fathi et al. |
| 2019/0147221 A1 | 5/2019 | Grabner et al. |
| 2019/0188337 A1 | 6/2019 | Keane |

OTHER PUBLICATIONS

Current Claims in application No. PCT/US19/63092, dated Feb. 2020, 5 pages.
Christensson, Per. "Wireframe Definition." TechTerms. Sharpened Productions, Mar. 22, 2017. Retrieved on Jun. 22, 2020 from https://techterms.com/definition/wireframe. (Year: 2017).
Extended European Search Report in Counterpart European Application No. 19896642.6 dated Aug. 10, 2022.
Suveg, I. "Reconstruction of 3D building models from aerial images and maps", ISPRS Journal of Photogrammetry & Remote Sensing, 2004, vol. 58, No. 3-4, pp. 202-224.

GENERATING AND VALIDATING A VIRTUAL 3D REPRESENTATION OF A REAL-WORLD STRUCTURE

PRIORITY CLAIM

This application is a continuation of U.S. application Ser. No. 16/220,900, filed on Dec. 14, 2018, which is incorporated by reference herein in its entirety.

FIELD

The present invention relates to digital image processing and more specifically generating a 3D representation of a real-world structure using a set of images.

BACKGROUND

Three-dimensional (3D) representations of a building may be generated based on two-dimensional (2D) digital images taken of the building. The digital images may be taken via aerial imagery, specialized-camera equipped vehicles, or by a user with a camera. The 3D building representation is a digital representation of the physical, real-world building. An accurate 3D representation may be used to derive various building measurements or to estimate design and renovation costs. However, generating a 3D representation of a building requires significant time and resources.

Furthermore, using typical techniques, not all 2D images can produce an accurate 3D representation. For example, if the 2D images used to create a 3D representation are only of the front of a building, the back of the 3D representation of the building is likely to be inaccurate. Similarly, if portions of a building are obscured by other objects in the image, then the obscured portions may not be represented accurately in the 3D representation. As another example, if the image capture device was tilted while capturing the photo, the proportions of building features derived from the image may be skewed. Generating an accurate 3D representation from such images may be difficult, time-consuming, or impossible, depending on the quality of the images. In this context, a set of photos is deemed to have "high quality" if deriving an accurate 3D representation from the set of photos is possible without extraordinary effort, while a set of photos is deemed to have "low quality" if deriving an accurate 3D representation from the set of photos is relatively difficult or impossible. As such, in this context "quality" does not relate to the artistic or aesthetic value of a photo.

Therefore, efficient methods for generating more accurate 3D representations from 2D images are desired.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

Techniques are described herein for generating a virtual 3D representation of a structure based on a set of digital images of the real-world structures. As used herein, the term "structure" refers to any real-world 3-dimensional object. Structures may include, for example, houses, offices and other buildings, walls, and etc. For the purpose of explanation, examples are described herein where the 3D representation is for a house. However, the techniques described herein are not limited to any particular type of structure. Using the techniques described herein, a representation of a structure is generated based on correlating geometric constraints of the structure with features of the structure depicted in digital images.

Specifically, to build the representation of a structure, the structure category of the structure is determined, and the geometric constraints of that structure category are used, in combination with the set of digital images that depict the structure, to construct the representation. Geometric constraints for a structure category indicate geometric features and/or geometric properties associated with structures of the structure category.

When building the representation, the geometric constraints can compensate for information the is not available from the digital images. For example, to build the representation of a house that is of a particular known style, the features of the back side of the house may be determined based on the geometric constraints of that particular style of house, even though unobscured images of the back side of the house may not be available, or images of the back side of the house are not available. Thus, the techniques described herein provide a method for generating a 3D representation of a structure even when high quality images and/or images depicting every side of the structure are not available.

System Overview

Figure 1:
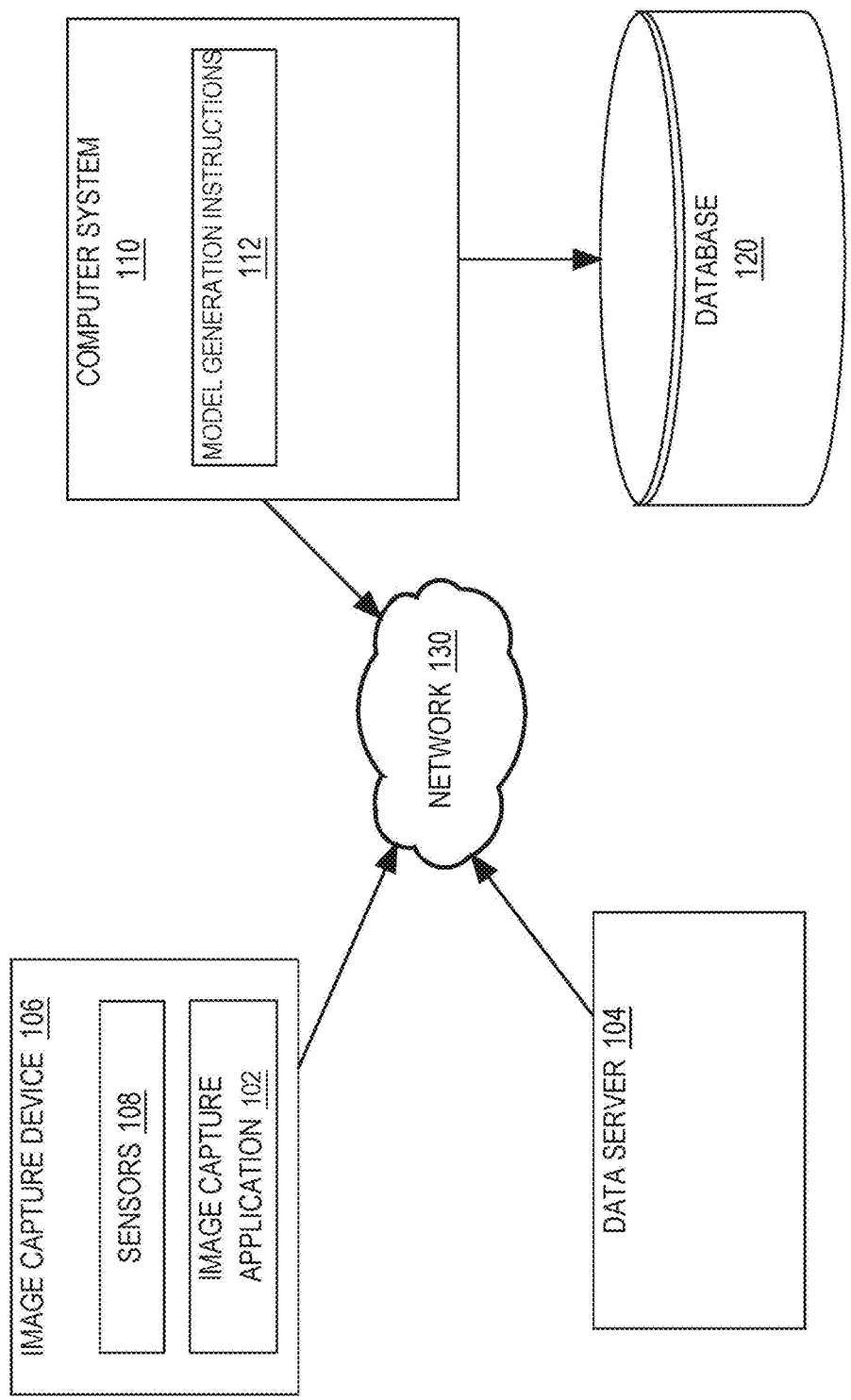
FIG. 1 illustrates an example computer system configured to perform the functions described herein.

FIG. 1 illustrates an example computer system 110 that is configured to perform the techniques described herein. In the illustrated embodiment, computer system 110 is communicatively coupled via a network 130 to a data server 104 and an image capture device 106. Example computer system 110 may include, or communicate with, other devices including computing devices, image capture devices, databases and other data storage devices, and display devices, according to embodiments. For example, a plurality of image capture devices and data servers may be communicatively coupled to computer system 110. As another example, one or more of the services attributed to computer system 110 herein may be run on other computing devices that are communicatively coupled to network 130.

Computer system 110 may be implemented by any type of computing device that is communicatively coupled to network 130. Example implementations of computer system 110 include, but are not limited to, workstations, personal computers, laptops, multi-processor systems, and the like. Although FIG. 1 shows a single element, computer system 110 may comprise one or more computers, such as a server cluster, and the computer system 110 may be located in one or more physical locations.

In the illustrated embodiment, computer system 110 is communicatively coupled to a database 120, which stores images received at computer system 110. Database 120 may also store metadata associated with each image. In one embodiment, database 120 is a data storage subsystem consisting of programs and data that is stored on any suitable storage device such as one or more hard disk drives, memories, or any other electronic digital data recording device configured to store data. Although database 120 is depicted as a single device in FIG. 1, database 120 may span multiple devices located in one or more physical locations. Database 120 may be internal or external to computer system 110.

In some embodiments, computer system 110 may download, obtain, or receive digital images from various sources, such as data server 104 or image capture device 106. Example sources include image capture devices, remote computing devices, such as mobile phones or server computers.

Data server 104 may be any computing device, including but not limited to: servers, racks, work stations, personal computers, laptops, Internet appliances, wireless devices, wired devices, multi-processor systems, and the like. Although FIG. 1 shows a single element, the data server 104 broadly represents one or more multiple server computers, such as a server cluster, and data server 104 may be located in one or more physical locations. Data server 104 may also represent one or more virtual computing instances that execute using one or more computers in a datacenter such as a virtual server farm. Data server 104 may receive or obtain digital images from an image capture device 106, users, other data servers, or other sources. Data server 104 may also transmit digital images to computer system 110.

Image capture device 106 may be any device that can capture or record images and videos. For example, image capture device 106 may be any computing device with a built-in camera or a communicatively coupled digital camera. Example image capture devices include mobile phones, tablets, a computer with a webcam, a drone, or a specialized camera-equipped vehicle. In the illustrated embodiment, image capture device 106 includes one or more sensors 108. Sensor data from sensors 108 may be stored in association with digital images captured by image capture device 106. Example sensors include, but are not limited to, global positioning system (GPS), accelerometers, altimeters, gyroscopes, magnetometers, temperature sensors, light sensors, and proximity sensors. The number and types of sensor data associated with a digital image may vary depending on the image capture device and the particular implementation.

In the illustrated embodiment, image capture device 106 is connected to data server 104 and computer system 110 via network 130. Image capture device 106 may be configured to transmit images directly to a data server 104 or to computer system 110.

In an embodiment, image capture application 102 comprises instructions for receiving input from image capture device and transmitting a captured image to computer system 110. Computer system 110 may generate a 3D representation of a structure based on the images received from image capture device 106. In some embodiments, image capture application 102 comprises instructions for performing one or more functions related to generating the 3D representation, such as: identifying landmarks in a captured image, validating identified landmarks, generating the 3D representation, and/or validating the generated 3D representation.

Image capture application 102 may also provide prompts to the user while the user captures an image or video. The prompts may include prompts to identify landmarks in a captured image, or prompts to re-capture a particular image. For example, image capture application 102 may determine that a 3D representation may not be accurately generated based on the provided images, determine a particular image that may be causing the error, and provide an indication on a display that the particular image should be re-captured.

Computer system 110 further comprises representation generating instructions 112. Representation generation instructions 112 comprise one or more instructions which, when executed by computer system 110, cause computer system 110 to analyze a set of digital images and generate representation of a structure depicted in the set of digital images.

For the purpose of illustrating a clear example, certain operations, functions, and programming are ascribed to the representation generating instructions 112 of FIG. 1. However, in other embodiments, one or more of the operations, functions, and programming may be implemented in programs or logic that is separate from the representation generating instructions 112. For example, the functions of determining whether a structure is categorizable or identifying landmarks in digital images may be implemented in a utility program or library. As another example, some or all of the functions of representation generating instructions 112 may be implemented by image capture application 102 on image capture device 106.

Geometric Constraints

Structures that have similar shapes and features belong to the same "structure category". A structure category may include an overall structure for which a 3D representation is being generated and/or a subset of the overall structure for which a 3D representation is being generated. For example, a T-shaped structure may belong to a T-shaped structure category, or the structure may be divided into two sub-structures, each belonging to a rectangular structure category.

For each particular structure category, "geometric constraints" indicate geometric properties that are expected of structures that belong to the particular structure category. Expected geometric properties may include, for example, how sides of the structure intersect one another, how sides of the building correlate with one another, expected features of one or more sides of the structure, how features correlate with one another, etc. Additionally, a structure may be broken down into a plurality of sub-structures. The expected geometric properties may indicate the plurality of sub-structures and As an example, for a cubed structure, expected geometric properties may include: the width, length, and height of the structure are equal; sides of the structure intersect at 90-degree angles; the front of the structure is the same size and shape as the back of the structure; the left side of the structure is the same size and shape as the front side of the structure; etc.

Using the geometric constraints, properties of the structure may be inferred based on other properties of the structure. Referring to the cubed structure, the size and shape of the back of the structure may be inferred based on information about the front of the structure.

In other words, the geometric constraints describe how representation generation of a structure may be parameterized. In the current example, based on the geometric constraints of the cubed structure, the parameters needed to generate a representation of the cubed structure are the length, width, and height of the structure.

Example Structure Categories

Figure 3:
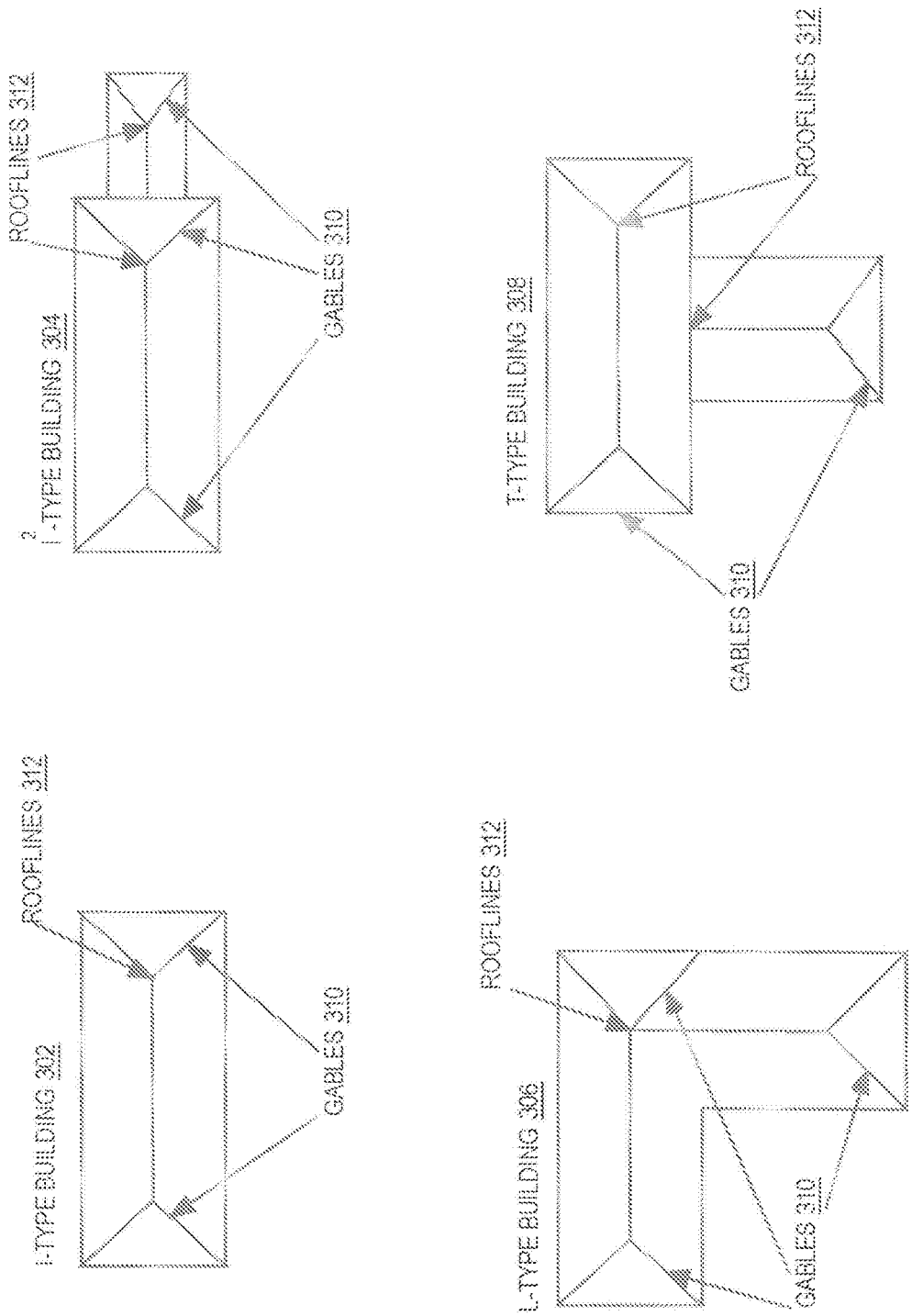
FIG. 3 illustrates example structure categories.

FIG. 3 illustrates top-down views of four structures, 302-308. Each of structures 302-308 illustrate a different example structure category. For the purpose of illustrating a clear example, assume structures 302-308 are buildings. Each structure has a different shape and includes a different number and position of gables 310 and rooflines 312. Additionally, structures 304-308 each comprise a plurality of sub-structures 314.

Structure 302 illustrates an example I-type building. I-type buildings, such as structure 302, comprise a single rectangular prism with two gables 310, one on each end of the building. Geometric constraints for I-type buildings may be, for example, front and back sides of the structure have matching shapes and sizes; left and right sides of the structure have matching shapes and sizes; one pair of sides are longer than the other pair of sides; two facing sides each have a gable; rooflines on the sides with gables intersect at an apex; etc.

Structure 304 illustrates an example $I^2$-type building. $I^2$-type buildings, such as structure 304, comprise two rectangular prisms that are connected end-to-end (i.e., along the short sides of the prisms), and three gables—two on the larger rectangular prism and one on the smaller rectangular prism. Geometric constraints for $I^2$-type buildings may be, for example, two rectangular-shaped sub-structures; one sub-structure is larger than the other; the rectangular-shaped sub-structures connect at a short side of each sub-structure; the non-connected side of the smaller sub-structure has a gable; the short sides of the larger sub-structure each have a gable; etc. Additionally, geometric constraints for each sub-structure may include geometric constraints for I-type buildings.

Structure 306 illustrates an example L-type building. L-type buildings, such as structure 306, comprise two rectangular prisms that are connected long end to short end at the corners (i.e., forming an "L" shape), and three gables—two on the larger rectangular prism and one on the smaller rectangular prism. Geometric constraints for L-type buildings may be, for example, two rectangular-shaped sub-structures; one sub-structure is larger than the other; the rectangular-shaped sub-structures connect at a corner of each sub-structure; the non-connected side of the smaller sub-structure has a gable; the short sides of the larger sub-structure each have a gable; etc. Additionally, geometric constraints for each sub-structure may include geometric constraints for I-type buildings.

Structure 308 illustrates an example T-type building. T-type buildings, such as structure 308, comprise two rectangular prisms that are connected at the middle of the long end of at least one of the rectangular prisms (i.e., forming a "T" shape), and three gables—two on the larger rectangular prism and one on the smaller rectangular prism. Geometric constraints for T-type buildings may be, for example, two rectangular-shaped sub-structures; one sub-structure is larger than the other; the rectangular-shaped sub-structures connect at the middle of the larger sub-structure; the non-connected side of the smaller sub-structure has a gable; the short sides of the larger sub-structure each have a gable; etc. Additionally, geometric constraints for each sub-structure may include geometric constraints for I-type buildings.

In an embodiment, the geometric constraints comprise one or more equations or formulas. Each equation or formula may indicate how sides, edges, points, and/or other features of the structure correlate and/or connect with one another.

As described in further detail below, a 3D representation of a structure of a particular structure category is generated based on the stored geometric constraints associated with the particular structure category.

Generating a 3D Representation Based on Structure Category

Figure 2:
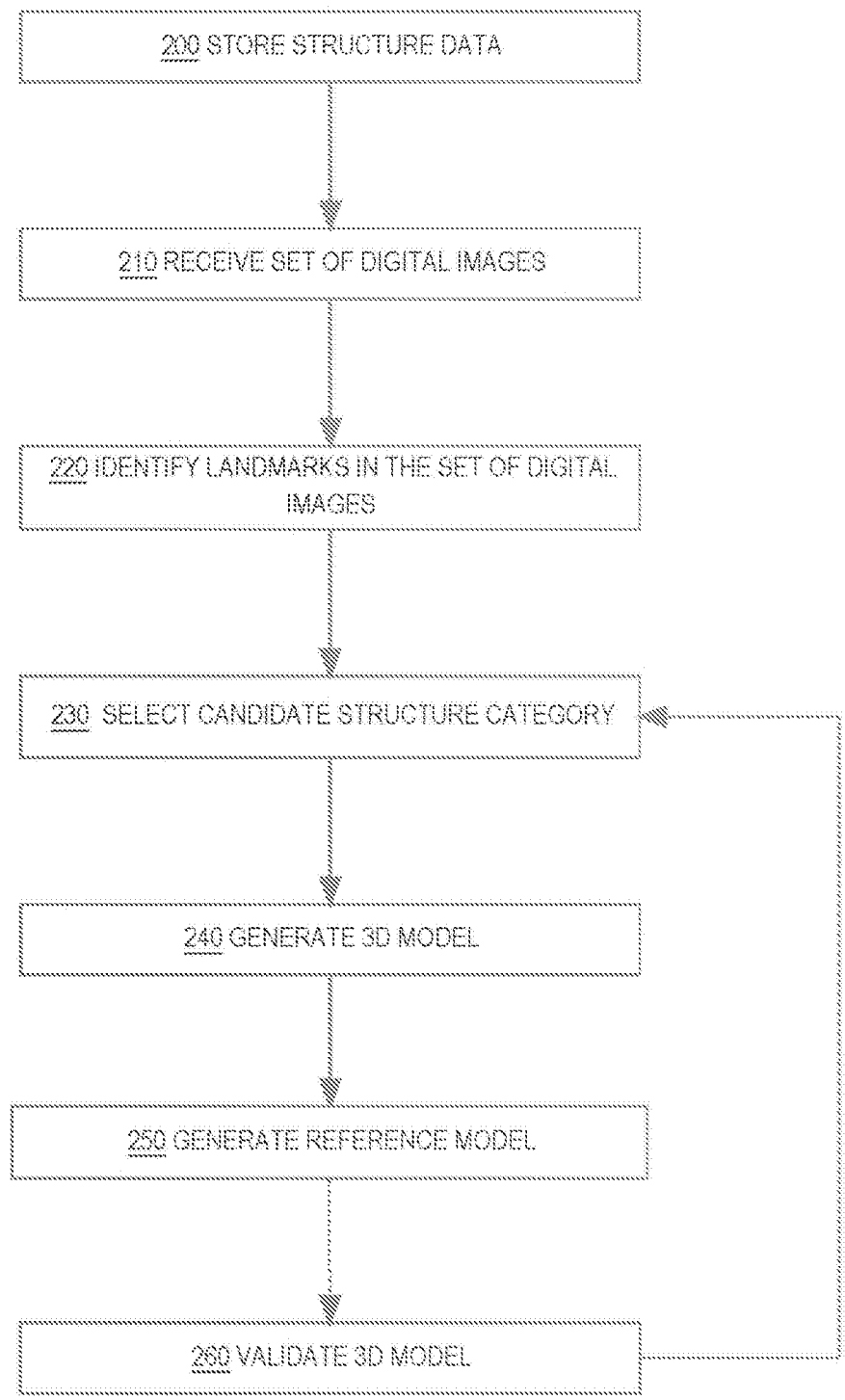
FIG. 2 illustrates an example process for generating a 3D representation from a set of digital images.

FIG. 2 illustrates an example flowchart for generating a 3D representation based on a set of digital images and the geometric constraints of a structure category, according to an embodiment.

The 3D representation is a digital representation of the physical, real-world building. The 3D representation may be used to derive various building measurements or to estimate design and renovation costs.

At step 200, a computer system stores structure data indicating geometric constraints corresponding to one or more structure categories. For example, computer system 110 may store structure data in database 120.

At step 210, the computer system receives a set of digital images. The digital images may be, for example, photos, frames extracted from film or video, or any other digital data that represents the appearance of a structure or portion(s) of a structure. The digital images may be received or retrieved from a single source or a plurality of sources. For example, computer system 110 may receive or retrieve digital images from one or more of data server 104, image capture device 106, or database 120.

The 3D representation is generated based on the set of digital images. In an embodiment, the set of digital images comprise a plurality of lateral images. The set of digital images depict a particular building, and each digital image of the image set may depict a different view of the particular building. Additionally, each digital image may be taken at a different height. For example, a hand-held camera or a camera mounted on a stick or drone may be positioned at various heights to avoid visual obstructions.

A digital image may capture a front-facing view or a corner view. A front-facing view depicts a single side of the building, such as the front, back, left or right of the building. A corner view depicts two or more sides of the building, such as the back-left or the back-right of the building.

In an embodiment, the set of digital images comprises at least one digital image for each side of the particular building and/or at least one digital image for each corner of the particular building. Although examples are described herein with reference to a building that has four sides, the techniques described herein are not limited to any number of sides. The number and types of digital images in an image set may vary depending on the particular building and/or the particular embodiment.

In some embodiments, the set of digital images may include fewer digital images and may not depict all sides or all corners of the particular building. As discussed in further detail below, one benefit of utilizing geometric constraints is that one or more portions of the particular building may be inferred even when the set of digital images does not depict the one or more portions. Thus, the set of digital images does not need to depict every side and every corner of the particular building.

Figure 4:
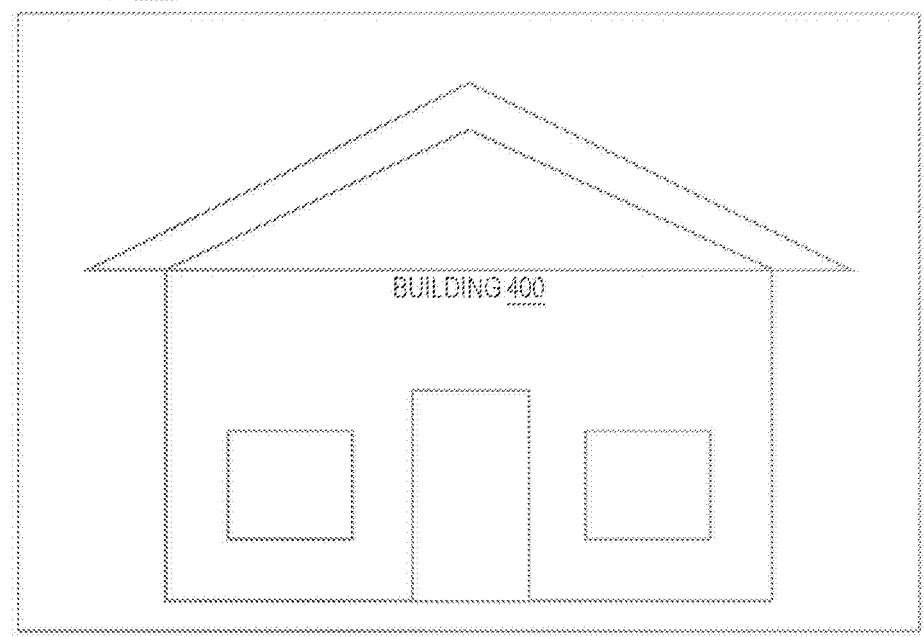
FIG. 4 illustrates example digital images of a structure.
Figure 4:
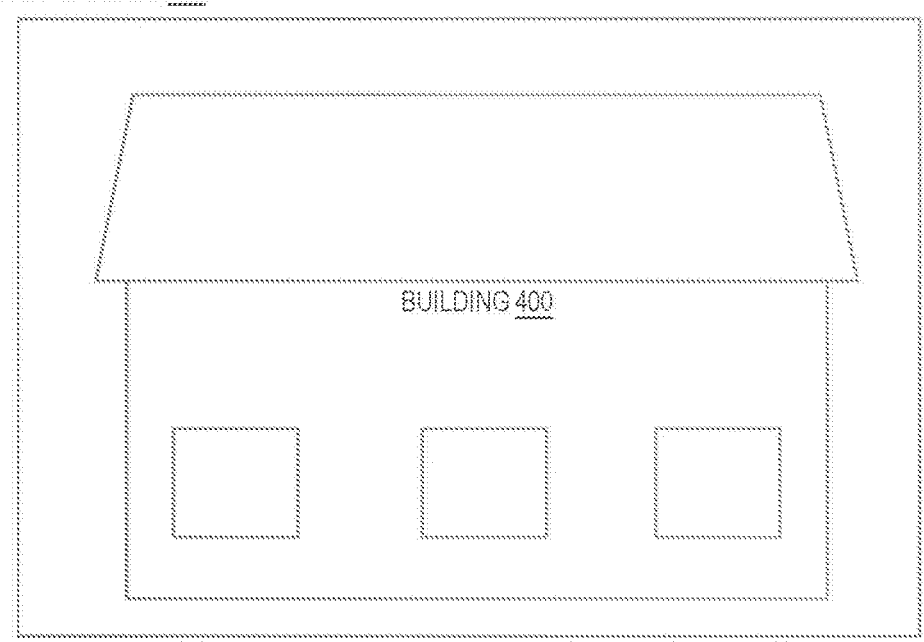

FIG. 4 illustrates example digital images 400 and 410. For the purpose of illustrating a clear example, assume images 410 and 420 depict different views of an I-type building, 400. Digital image 410 depicts a front-facing view of building 400 and digital image 420 depicts a side view of building 400.

Each digital image may also include metadata associated with the digital image. The metadata may be stored with the digital image or provided to the computer system in association with the digital image. The metadata indicates information related to the digital image and/or to objects depicted in the image. For example, metadata may indicate the location where the digital image was captured. As another example, a user or other data source may provide information related to the building depicted in the digital image, such as whether particular elements are present in the digital image, dimensions of particular elements of the building, the location of walls or roofs in the building, intersection points or end points of roofs or walls of the building, and etc. The information may be stored as metadata associated with the image.

In an embodiment, metadata associated with a digital image includes sensor data from the image capture device that captured the digital image. As described above, example sensors include, but are not limited to, global positioning system (GPS), accelerometers, altimeters, gyroscopes, magnetometers, temperature sensors, light sensors, and proximity sensors. Sensor data may include, for example, azimuth, gravity, linear velocity, angular velocity, distance to an object, and etc.

In an embodiment, metadata associate with a digital image includes the position of the camera at that point, represented by its transformation and projection matrix and other positional and rotational information.

In an embodiment, metadata associated with a digital image includes view information. The view information may indicate the side or sides of the building depicted in the image. For example, view information for a digital image may indicate that the digital image depicts the front of a building.

In an embodiment, metadata associated with a digital image includes sequence information. The sequence information indicates a sequence of the digital image within the set of digital images. For example, an image corresponding to the front of the building may be sequence number 0, an image corresponding to the front-right of the building may be sequence number 1, an image corresponding to the right of the building may be sequence number 2, and etc.

In an embodiment, the metadata associated with a digital image includes one or more lines corresponding to features of the structure depicted in the digital image. For example, the lines may correspond to outlines of doors or windows, rooflines, walls, posts, and/or pillars of the portion of the structure that is shown in the digital image. Referring to FIG. 4, the metadata may indicate the outlines of building 400 depicted in images 410 and 420.

In an embodiment, the outlines are drawn by a user, for example, user input via a graphical user interface. The user may mark-up a digital image with lines indicating the outline of the structure depicted in the digital image. In other embodiments, the lines may be automatically generated by computer system 110, for example, using machine learning, image analysis, edge detection, or other methods for identifying lines within a digital image.

In an embodiment, the computer system receives the set of digital images in response to a determination that the particular structure is able to be categorized, e.g. into the one or more stored structure categories. Determining whether the particular structure is categorizable may be based on features of the structure and/or the set of digital images, such as whether the structure has straight or curved lines; whether the structure is visible in each image of the set of digital images; whether the structure appears to be one of the stored structure categories; etc.

In some embodiments, the determination is based on user input indicating that the particular structure is categorizable. For example, a user capturing images using image capture device 106 may indicate whether the particular structure is suitable for categorization. In other embodiments, the computer system may analyze the set of digital images to determine whether the particular structure is categorizable. For example, computer system 110 may determine whether the set of digital images depict a categorizable structure using machine learning.

Landmarks

In step 220, for each digital image of the set of digital images, one or more landmarks depicted in the digital image are identified. A landmark is a point, line, or shape that identifies a portion of the particular structure in the digital image that is meaningful or relevant in generating a 3D representation. Example landmarks include: lines that form a gable, lines around windows and doors, lines marking the side of a building, the apex and lower apex of the roof, fascia lines, eve lines, etc.

Additionally, the computer system may generate metadata corresponding to the one or more landmarks, such as labels indicating the location, shape, structure feature, etc. of the landmark. The metadata may be stored in association with the digital image. Alternately, the metadata may be cached in memory of the computer system.

Figure 5:
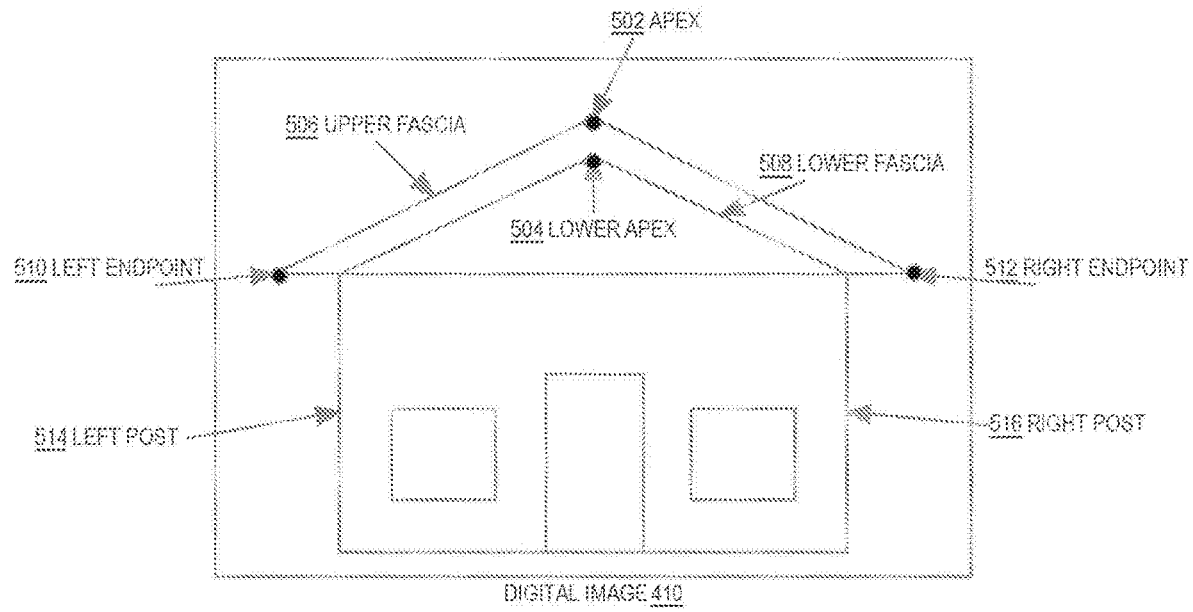
FIG. 5 illustrates example landmarks in digital images.
Figure 5:
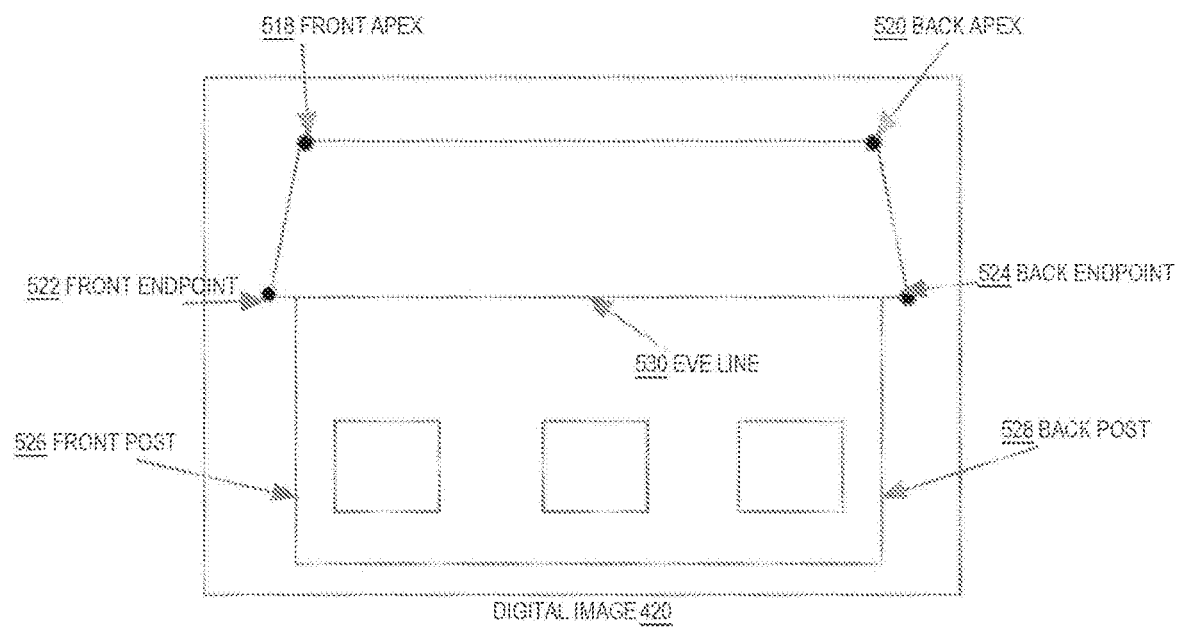

FIG. 5 illustrates landmarks identified in digital image 410 and 420. In FIG. 5, digital image 410 includes landmarks 502-516. The landmarks 502-516 correspond to the apex of the roof, the lower apex of the roof, the upper fascia, the lower fascia, the left endpoint of the roof, the right endpoint of the roof, the left post of the building, and the right post of the building, respectively. Digital image 420 includes landmarks 518-528. The landmarks 518-528 correspond to the front apex of the roof, the back apex of the roof, the front endpoint of the roof, the back endpoint of the roof, the front post of the building, the back post of the building, and the eve line, respectively.

In the illustrated example, each landmark comprises a point or a line within the digital image. Computer system 110 may generate metadata identifying the location and shape of each point or line, and a label corresponding to the point or line. For example, computer system 110 may generate metadata indicating the location of the apex point 502 and that it is an apex (gable).

In an embodiment, the identification is based on user input indicating one or more landmarks in the digital image. For example, a user capturing images using image capture device 106 may identify one or more landmarks in a captured image. The user may also label each landmark with information describing the landmark. As another example, outlines of the structure depicted in the digital image are drawn by a user. The computer system may analyze the outlines in each digital image to identify one or more portions of the outlines as landmarks.

In other embodiments, the computer system may automatically analyze each digital image of the set of digital images to determine which portions of the digital image may be landmarks using, for example, image analysis, edge detection, or other techniques. In an embodiment, identifying the one or more landmarks comprises determining a view of the building (e.g. front, side, corner), determining one or more expected landmarks for the view, and identifying one or more of the expected landmarks within the digital image. In other embodiments, identifying the one or more landmarks comprises analyzing the image to determine one or more potentially significant areas, such as areas where multiple lines intersect, or areas depicting structure features such as doors or windows.

In an embodiment, after identifying the one or more landmarks, the computer system generates metadata corresponding to the one or more landmarks, such as data indicating the location, shape, corresponding structure feature, etc. of the landmark. The metadata may be stored in association with the digital image. Alternately, the metadata may be cached in memory of the computer system for use when generating the 3D representation.

In an embodiment, after identifying one or more landmarks in each digital image of the set of digital images, landmarks are correlated between the digital images. Correlating two landmarks comprises determining that a first landmark in a first digital image corresponds to a second landmark in a second digital image. Referring to FIG. 5, apex 502 in image 410 may be correlated with front apex 516 in image 412. The computer system may generate and store data that maps the correlation between landmarks. The data may be separate from the previously-generated landmark metadata, or may be added to the landmark metadata.

In an embodiment, if a particular landmark has no correlating landmarks in one or more other images, then the particular landmark may be incorrect. In an embodiment, in response to determining that one or more landmarks in a digital image are incorrect, step 220 is repeated for the digital image, and one or more new landmarks are identified. The one or more new landmarks may be re-correlated and verified. If repeated landmark identification continues to result in incorrectly identified landmarks, then the process may be terminated. Additionally or alternatively, a user may be notified that the one or more particular digital images in which incorrect landmarks were identified should be re-taken. For example, a notification may be displayed at a display of image capture device 106. The notification may indicate the particular image(s) that should be re-captured. Additionally, the notification may indicate particular areas, e.g. areas with incorrectly identified landmarks, that may need to be captured from a different angle or position.

In an embodiment, each image includes information identifying features depicted in the image. The identification may be performed, for example, manually by a user, automatically by the computer system or other computing device, or a combination thereof. As an example, the presence of a wall may be identified via a vertical plane detection algorithm or an opening for a window may be identified by its rectangular frame via an image detection algorithm. As another example, a user may identify a down spout on a corner of the building exterior.

In an embodiment, each of the different features or landmarks are assigned unique identifiers. Additionally, the location of each feature or landmark may be represented by various camera parameters like transformation and projection matrices. As explained in further detail below, a 3D representation may be generated by identifying relationships between features or landmarks that appear in multiple images.

Generate 3D Representation

In step 230, a candidate structure category is selected from the plurality of structure categories.

In an embodiment, selecting the candidate category is based on the identified landmarks in the set of digital images. For example, if based on the landmarks, two gables were identified, then the candidate structure category may be "I" building type. Similarly, if three gables were identified, then the candidate structure category may be "T," "L," or "I². " The particular category may also depend on the arrangement of the landmarks in the digital image(s).

In other embodiments, the plurality of categories may be stored in an order, and the first category is selected as the candidate category. Subsequent categories may be selected if the steps are repeated, i.e. if the first category is determined to not be a match.

As an example, based on the landmarks identified in digital images 410 and 420, computer system 110 may select the I-type building as the structure category.

In step 240, a 3D representation is generated based on the geometric constraints associated with the candidate category and the identified landmarks. As discussed above, the geometric constraints indicate how various portions of the structure connect or correlate with one another. Additionally, particular building structures that have known or standardized measurements, such as doors or windows, may be used to determine the scale of other portions of the structure. For example, assume the top and bottom of the structure, as well as a door in the structure, have been identified. The height of the structure may be determined by comparing the distance between the top and bottom of the structure to the height of the door.

In an embodiment, generating the 3D representation comprises generating a surface corresponding to one or more sides of the structure. Referring to the above example, a first surface may be generated corresponding to the front of building 400 based on the landmarks identified for digital image 410, and a second surface may be generated corresponding to the side of building 400 based on the landmarks identified for digital image 420. The stored geometric constraints may indicate how to connect the first surface and the second surface. Additionally, the stored geometric constraints may indicate how to generate one or more other surfaces. For example, the first surface may be replicated for the back of building 400 and/or the second surface may be replicated for the other side of building 400. The surfaces are connected to generate a 3D representation of building 400.

Additionally or alternatively, generating the 3D representation comprises extruding one or more generated surfaces to form a 3D shape. Referring to the above example, a first surface may be generated corresponding to the front of building 400 based on the landmarks identified for digital image 410. The first surface may be extruded towards the back of the building based on the landmarks identified for digital image 420 (i.e., the side of the building). For example, the distance between the front post and the back post may be used to determine how far to extrude the first surface. Additionally, the extrusion may be modified based on the landmarks identified in other digital images, such as digital image 420. For example, the angle between the front apex and the front endpoint may be used to modify the angle or tilt of the fascia in the first surface. As another example, windows or other building features may be added to the side of the 3D representation, based on the landmarks identified in digital image 420.

Additionally or alternatively, generating the 3D representation comprises extruding two or more lines to form a surface. For example, the two lines forming the apex (gable) at the front of the building may be extruded or projected to form the structure of the roof.

Validating 3D Representation

In step 250, a reference representation is generated for validating the 3D representation. A reference representation may be either two or three dimensional. Example reference representations include digital image from the set of digital images, an outline of the structure, a wireframe representation, or a rough 3D representation of the structure. If the difference between the generated 3D representation and the reference representation is greater than a particular threshold value, then the computer system may determine that the generated 3D representation is invalid. In an embodiment, the reference representation is generated based on one or more outlines of the particular structure. As discussed above, outlines of the particular structure may be automatically generated and/or provided via user input. The reference representation may comprise, for example a wireframe representation generated by combining the one or more outlines, or one or more images depicting the outlines.

In step 260, the generated 3D representation is validated based on the reference representation. In an embodiment, validating the generated 3D representation based on the reference representation comprises projecting or overlaying the generated 3D representation against the reference representation. The re-projection or overlay may be performed using any suitable re-projection algorithms or techniques.

A re-projection error is calculated based on the projection or overlay. The re-projection error may be a ratio, percentage, or value that indicates an amount by which the generated 3D representation differs from the reference representation. Alternately, the re-projection error comprises data identifying one or more areas in which the generated 3D representation differs from the reference representation. The generated 3D representation may differ from the reference representation if, for example, projected lines from the 3D representation do not overlap with lines in the reference representation; or projected areas of the 3D representation are larger than, smaller than, or in different areas than the reference representation.

As an example, the generated 3D representation may be projected onto one or more digital images of the set of digital images. The projection is compared with the structure depicted in each digital image to determine how much the projection deviates from the depicted structure. As another example, the generated 3D representation may be compared against one or more outlines and/or a wireframe representation generated from one or more outlines to determine how much the 3D representation deviates from the outlines.

In an embodiment, if the re-projection error exceeds a particular threshold value, then the computer system determines that the candidate structure category is incorrect. If the re-projection error is below the particular threshold value, then the computer system determines that the candidate structure category was correct. The threshold value may differ depending on, for example, the candidate structure category, user configurations such as tolerance amounts, the data or value represented by the re-projection error, etc. For example, each structure category may be associated with a different threshold value. As another example, if the re-projection error represents a percentage match then the threshold value may be a minimum percentage value. If the re-projection error identifies mis-matched areas, the threshold value may be a number of mis-matched areas and/or a size of the mis-matched areas.

In an embodiment, in response to determining that the candidate structure category is incorrect, steps 230-260 are repeated. When repeating steps 230-260, a different candidate structure category may be selected and a new 3D representation is generated based on the different candidate structure category. Alternately, the same candidate structure category may be selected, but a new 3D representation may be re-generated. In some embodiments, the reference representation is not re-generated when repeating steps 230-260. The new 3D representation is compared against the previously generated reference representation.

In an embodiment, steps 230-260 may be repeated until the re-projection error for a particular 3D representation is lower than the particular threshold value, until each structure category of the plurality of structure categories have been tried or until a pre-configured number of structure categories have been tried. If no 3D representation is generated for which a re-projection error is lower than the threshold value, then the computer system may generate an indication that the 3D representation could not be generated. Additionally, the computer system may determine if one or more particular portions of the generated 3D representation(s) were the source of re-projection errors. The computer system may generate an indication that the one or more particular portions differ from the reference representation. Additionally or alternatively, the computer system may generate an indication that additional digital images depicting the one or more particular portions are desired.

In an embodiment, the amount by which portions of the 3D representation deviate from the reference representation is determined. If a particular portion of the 3D representation deviates more than a threshold amount from a corresponding portion of the reference representation, the computer system may determine that the particular portion of the 3D representation is incorrect. For example, a 3D representation may substantially match a reference representation, but a rear gable that is in the 3D representation is not in the reference representation. The computer system may generate an indication that the particular portion of the 3D representation differs from the reference representation. For example, the computer system may highlight the portion of the digital image and/or the 3D representation where the mis-match occurred.

Additionally or alternatively, the computer system may generate a request for additional or alternative digital images. Referring to the above example, the computer system may request a digital image that depicts the back of the building and/or the rear gable.

Hardware Overview

According to one embodiment, the techniques described herein are implemented by at least one computing device. The techniques may be implemented in whole or in part using a combination of at least one server computer and/or other computing devices that are coupled using a network, such as a packet data network. The computing devices may be hard-wired to perform the techniques, or may include digital electronic devices such as at least one application-specific integrated circuit (ASIC) or field programmable gate array (FPGA) that is persistently programmed to perform the techniques, or may include at least one general purpose hardware processor programmed to perform the techniques pursuant to program instructions in firmware, memory, other storage, or a combination. Such computing devices may also combine custom hard-wired logic, ASICs, or FPGAs with custom programming to accomplish the described techniques. The computing devices may be server computers, workstations, personal computers, portable computer systems, handheld devices, mobile computing devices, wearable devices, body mounted or implantable devices, smartphones, smart appliances, internetworking devices, autonomous or semi-autonomous devices such as robots or unmanned ground or aerial vehicles, any other electronic device that incorporates hard-wired and/or program logic to implement the described techniques, one or more virtual computing machines or instances in a data center, and/or a network of server computers and/or personal computers.

Figure 6:
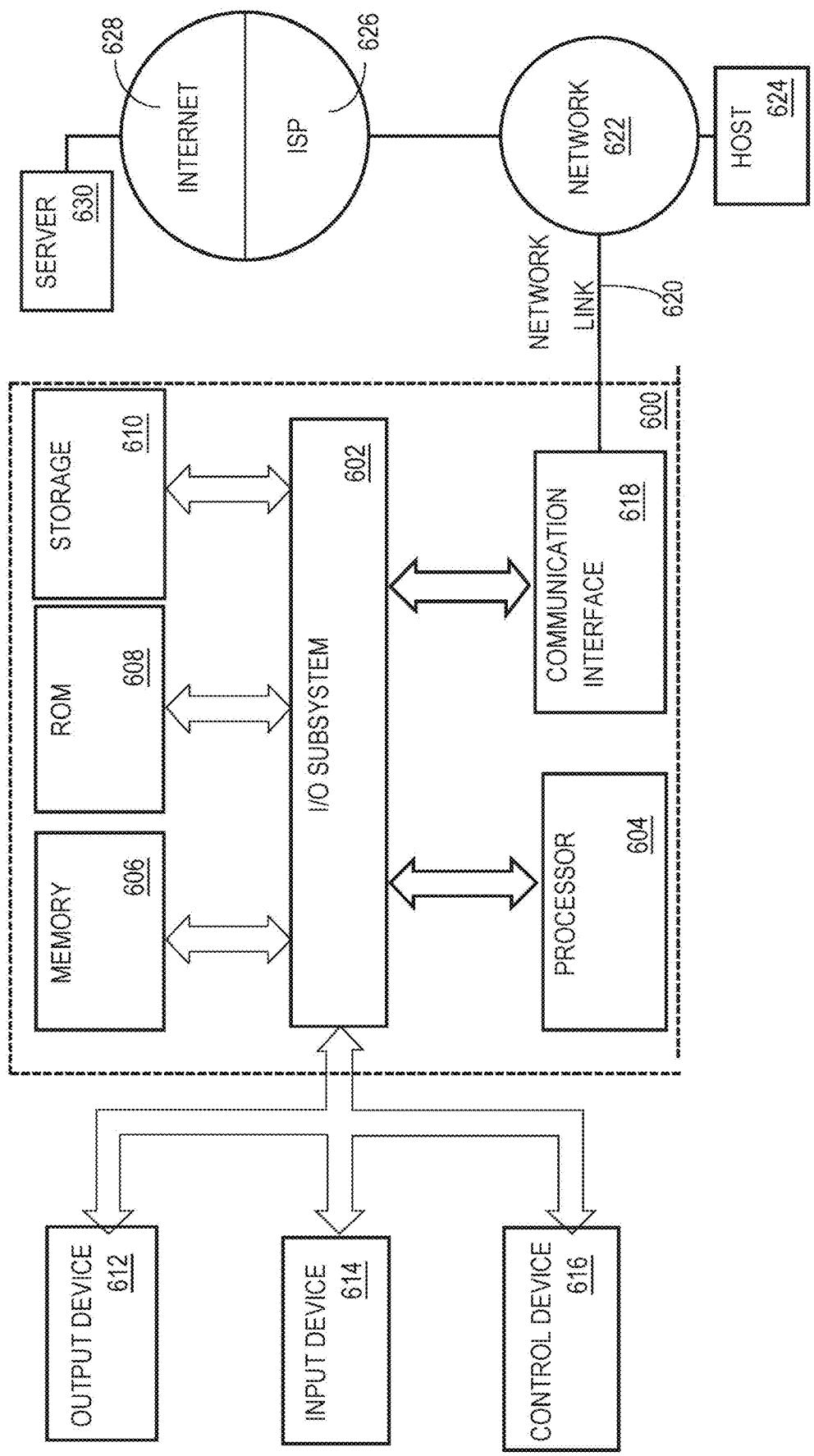
FIG. 6 is a block diagram illustrating a computer system that may be used to implement the techniques described herein.

FIG. 6 is a block diagram that illustrates an example computer system with which an embodiment may be implemented. In the example of FIG. 6, a computer system 600 and instructions for implementing the disclosed technologies in hardware, software, or a combination of hardware and software, are represented schematically, for example as boxes and circles, at the same level of detail that is commonly used by persons of ordinary skill in the art to which this disclosure pertains for communicating about computer architecture and computer systems implementations.

Computer system 600 includes an input/output (I/O) subsystem 602 which may include a bus and/or other communication mechanism(s) for communicating information and/or instructions between the components of the computer system 600 over electronic signal paths. The I/O subsystem 602 may include an I/O controller, a memory controller and at least one I/O port. The electronic signal paths are represented schematically in the drawings, for example as lines, unidirectional arrows, or bidirectional arrows.

At least one hardware processor 604 is coupled to I/O subsystem 602 for processing information and instructions. Hardware processor 604 may include, for example, a general-purpose microprocessor or microcontroller and/or a special-purpose microprocessor such as an embedded system or a graphics processing unit (GPU) or a digital signal processor or ARM processor. Processor 604 may comprise an integrated arithmetic logic unit (ALU) or may be coupled to a separate ALU.

Computer system 600 includes one or more units of memory 606, such as a main memory, which is coupled to I/O subsystem 602 for electronically digitally storing data and instructions to be executed by processor 604. Memory 606 may include volatile memory such as various forms of random-access memory (RAM) or other dynamic storage device. Memory 606 also may be used for storing temporary variables or other intermediate information during execution of instructions to be executed by processor 604. Such instructions, when stored in non-transitory computer-readable storage media accessible to processor 604, can render computer system 600 into a special-purpose machine that is customized to perform the operations specified in the instructions.

Computer system 600 further includes non-volatile memory such as read only memory (ROM) 608 or other static storage device coupled to I/O subsystem 602 for storing information and instructions for processor 604. The ROM 608 may include various forms of programmable ROM (PROM) such as erasable PROM (EPROM) or electrically erasable PROM (EEPROM). A unit of persistent storage 610 may include various forms of non-volatile RAM (NVRAM), such as FLASH memory, or solid-state storage, magnetic disk or optical disk such as CD-ROM or DVD-ROM, and may be coupled to I/O subsystem 602 for storing information and instructions. Storage 610 is an example of a non-transitory computer-readable medium that may be used to store instructions and data which when executed by the processor 604 cause performing computer-implemented methods to execute the techniques herein.

The instructions in memory 606, ROM 608 or storage 610 may comprise one or more sets of instructions that are organized as modules, methods, objects, functions, routines, or calls. The instructions may be organized as one or more computer programs, operating system services, or application programs including mobile apps. The instructions may comprise an operating system and/or system software; one or more libraries to support multimedia, programming or other functions; data protocol instructions or stacks to implement TCP/IP, HTTP or other communication protocols; file format processing instructions to parse or render files coded using HTML, XML, JPEG, MPEG or PNG; user interface instructions to render or interpret commands for a graphical user interface (GUI), command-line interface or text user interface; application software such as an office suite, internet access applications, design and manufacturing applications, graphics applications, audio applications, software engineering applications, educational applications, games or miscellaneous applications. The instructions may implement a web server, web application server or web client. The instructions may be organized as a presentation layer, application layer and data storage layer such as a relational database system using structured query language (SQL) or no SQL, an object store, a graph database, a flat file system or other data storage.

Computer system 600 may be coupled via I/O subsystem 602 to at least one output device 612. In one embodiment, output device 612 is a digital computer display. Examples of a display that may be used in various embodiments include a touch screen display or a light-emitting diode (LED) display or a liquid crystal display (LCD) or an e-paper display. Computer system 600 may include other type(s) of output devices 612, alternatively or in addition to a display device. Examples of other output devices 612 include printers, ticket printers, plotters, projectors, sound cards or video cards, speakers, buzzers or piezoelectric devices or other audible devices, lamps or LED or LCD indicators, haptic devices, actuators or servos.

At least one input device 614 is coupled to I/O subsystem 602 for communicating signals, data, command selections or gestures to processor 604. Examples of input devices 614 include touch screens, microphones, still and video digital cameras, alphanumeric and other keys, keypads, keyboards, graphics tablets, image scanners, joysticks, clocks, switches, buttons, dials, slides, and/or various types of sensors such as force sensors, motion sensors, heat sensors, accelerometers, gyroscopes, and inertial measurement unit (IMU) sensors and/or various types of transceivers such as wireless, such as cellular or Wi-Fi, radio frequency (RF) or infrared (IR) transceivers and Global Positioning System (GPS) transceivers.

Another type of input device is a control device 616, which may perform cursor control or other automated control functions such as navigation in a graphical interface on a display screen, alternatively or in addition to input functions. Control device 616 may be a touchpad, a mouse, a trackball, or cursor direction keys for communicating direction information and command selections to processor 604 and for controlling cursor movement on display 612. The input device may have at least two degrees of freedom in two axes, a first axis (e.g., x) and a second axis (e.g., y), that allows the device to specify positions in a plane. Another type of input device is a wired, wireless, or optical control device such as a joystick, wand, console, steering wheel, pedal, gearshift mechanism or other type of control device. An input device 614 may include a combination of multiple different input devices, such as a video camera and a depth sensor.

In another embodiment, computer system 600 may comprise an internet of things (IoT) device in which one or more of the output device 612, input device 614, and control device 616 are omitted. Or, in such an embodiment, the input device 614 may comprise one or more cameras, motion detectors, thermometers, microphones, seismic detectors, other sensors or detectors, measurement devices or encoders and the output device 612 may comprise a special-purpose display such as a single-line LED or LCD display, one or more indicators, a display panel, a meter, a valve, a solenoid, an actuator or a servo.

When computer system 600 is a mobile computing device, input device 614 may comprise a global positioning system (GPS) receiver coupled to a GPS module that is capable of triangulating to a plurality of GPS satellites, determining and generating geo-location or position data such as latitude-longitude values for a geophysical location of the computer system 600. Output device 612 may include hardware, software, firmware and interfaces for generating position reporting packets, notifications, pulse or heartbeat signals, or other recurring data transmissions that specify a position of the computer system 600, alone or in combination with other application-specific data, directed toward host 624 or server 630.

Computer system 600 may implement the techniques described herein using customized hard-wired logic, at least one ASIC or FPGA, firmware and/or program instructions or logic which when loaded and used or executed in combination with the computer system causes or programs the computer system to operate as a special-purpose machine. According to one embodiment, the techniques herein are performed by computer system 600 in response to processor 604 executing at least one sequence of at least one instruction contained in main memory 606. Such instructions may be read into main memory 606 from another storage medium, such as storage 610. Execution of the sequences of instructions contained in main memory 606 causes processor 604 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage 610. Volatile media includes dynamic memory, such as memory 606. Common forms of storage media include, for example, a hard disk, solid state drive, flash drive, magnetic data storage medium, any optical or physical data storage medium, memory chip, or the like.

Storage media is distinct from but may be used in conjunction with transmission media. Transmission media participates in transferring information between storage media. For example, transmission media includes coaxial cables, copper wire and fiber optics, including the wires that comprise a bus of I/O subsystem 602. Transmission media can also take the form of acoustic or light waves, such as those generated during radio-wave and infra-red data communications.

Various forms of media may be involved in carrying at least one sequence of at least one instruction to processor 604 for execution. For example, the instructions may initially be carried on a magnetic disk or solid-state drive of a remote computer. The remote computer can load the instructions into its dynamic memory and send the instructions over a communication link such as a fiber optic or coaxial cable or telephone line using a modem. A modem or router local to computer system 600 can receive the data on the communication link and convert the data to a format that can be read by computer system 600. For instance, a receiver such as a radio frequency antenna or an infrared detector can receive the data carried in a wireless or optical signal and appropriate circuitry can provide the data to I/O subsystem 602 such as place the data on a bus. I/O subsystem 602 carries the data to memory 606, from which processor 604 retrieves and executes the instructions. The instructions received by memory 606 may optionally be stored on storage 610 either before or after execution by processor 604.

Computer system 600 also includes a communication interface 618 coupled to bus 602. Communication interface 618 provides a two-way data communication coupling to network link(s) 620 that are directly or indirectly connected to at least one communication networks, such as a network 622 or a public or private cloud on the Internet. For example, communication interface 618 may be an Ethernet networking interface, integrated-services digital network (ISDN) card, cable modem, satellite modem, or a modem to provide a data communication connection to a corresponding type of communications line, for example an Ethernet cable or a metal cable of any kind or a fiber-optic line or a telephone line. Network 622 broadly represents a local area network (LAN), wide-area network (WAN), campus network, internetwork or any combination thereof. Communication interface 618 may comprise a LAN card to provide a data communication connection to a compatible LAN, or a cellular radiotelephone interface that is wired to send or receive cellular data according to cellular radiotelephone wireless networking standards, or a satellite radio interface that is wired to send or receive digital data according to satellite wireless networking standards. In any such implementation, communication interface 618 sends and receives electrical, electromagnetic or optical signals over signal paths that carry digital data streams representing various types of information.

Network link 620 typically provides electrical, electromagnetic, or optical data communication directly or through at least one network to other data devices, using, for example, satellite, cellular, Wi-Fi, or BLUETOOTH technology. For example, network link 620 may provide a connection through a network 622 to a host computer 624.

Furthermore, network link 620 may provide a connection through network 622 or to other computing devices via internetworking devices and/or computers that are operated by an Internet Service Provider (ISP) 626. ISP 626 provides data communication services through a world-wide packet data communication network represented as internet 628. A server computer 630 may be coupled to internet 628. Server 630 broadly represents any computer, data center, virtual machine or virtual computing instance with or without a hypervisor, or computer executing a containerized program system such as DOCKER or KUBERNETES. Server 630 may represent an electronic digital service that is implemented using more than one computer or instance and that is accessed and used by transmitting web services requests, uniform resource locator (URL) strings with parameters in HTTP payloads, API calls, app services calls, or other service calls. Computer system 600 and server 630 may form elements of a distributed computing system that includes other computers, a processing cluster, server farm or other organization of computers that cooperate to perform tasks or execute applications or services. Server 630 may comprise one or more sets of instructions that are organized as modules, methods, objects, functions, routines, or calls. The instructions may be organized as one or more computer programs, operating system services, or application programs including mobile apps. The instructions may comprise an operating system and/or system software; one or more libraries to support multimedia, programming or other functions; data protocol instructions or stacks to implement TCP/IP, HTTP or other communication protocols; file format processing instructions to parse or render files coded using HTML, XML, JPEG, MPEG or PNG; user interface instructions to render or interpret commands for a graphical user interface (GUI), command-line interface or text user interface; application software such as an office suite, Internet access applications, design and manufacturing applications, graphics applications, audio applications, software engineering applications, educational applications, games or miscellaneous applications. Server 630 may comprise a web application server that hosts a presentation layer, application layer and data storage layer such as a relational database system using structured query language (SQL) or no SQL, an object store, a graph database, a flat file system or other data storage.

Computer system 600 can send messages and receive data and instructions, including program code, through the network(s), network link 620 and communication interface 618. In the Internet example, a server 630 might transmit a requested code for an application program through Internet 628, ISP 626, local network 622 and communication interface 618. The received code may be executed by processor 604 as it is received, and/or stored in storage 610, or other non-volatile storage for later execution.

The execution of instructions as described in this section may implement a process in the form of an instance of a computer program that is being executed, and consisting of program code and its current activity. Depending on the operating system (OS), a process may be made up of multiple threads of execution that execute instructions concurrently. In this context, a computer program is a passive collection of instructions, while a process may be the actual execution of those instructions. Several processes may be associated with the same program; for example, opening up several instances of the same program often means more than one process is being executed. Multitasking may be implemented to allow multiple processes to share processor 604. While each processor 604 or core of the processor executes a single task at a time, computer system 600 may be programmed to implement multitasking to allow each processor to switch between tasks that are being executed without having to wait for each task to finish. In an embodiment, switches may be performed when tasks perform input/output operations, when a task indicates that it can be switched, or on hardware interrupts. Time-sharing may be implemented to allow fast response for interactive user applications by rapidly performing context switches to provide the appearance of concurrent execution of multiple processes simultaneously. In an embodiment, for security and reliability, an operating system may prevent direct communication between independent processes, providing strictly mediated and controlled inter-process communication functionality.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method for forming a virtual 3D model of a real-world structure, the method comprising:
    receiving a plurality of captured images of the real-world structure;
    for each captured image of the plurality of captured images, identifying one or more landmarks in the captured image,
    providing metadata for the landmarks, the metadata for each landmark identifying a shape of the landmark and a label for the landmark;
    determining, from a plurality of structure categories, one or more structure categories applicable to the real-world structure based, at least in part, on one or more landmarks of the identified landmarks, wherein each structure category of the plurality of structure categories comprises structure data that defines an overall peripheral shape of structures that belong to the structure category;
    determining correlations between one or more landmarks of the identified landmarks in each captured image of the plurality of captured images, and one or more landmarks of the identified landmarks in each other captured image of the plurality of captured images;
    generating the virtual 3D model of the real-world structure based, at least in part, on:
        the plurality of captured images,
        the correlations between landmarks of the identified landmarks for the plurality of captured images; and
        geometrical constraints for the one or more structure categories applicable to the real-world structure.

2. The method of claim 1, wherein the one or more landmarks comprises one or more lines.

3. The method of claim 2, wherein the lines comprise one or more of: lines forming a gable, lines around windows and doors, lines marking a side of the real-world structure, an apex and a lower apex of a roof, fascia lines, and eve lines.

4. The method of claim 1, wherein identifying the one or more landmarks in the captured image comprises:
    determining a view of the real-world structure depicted by the captured image;
    determining one or more expected landmarks for the view; and
    identifying one or more of the expected landmarks within the captured image.

5. The method of claim 4, wherein the view of the real-world structure is one of a front, side, or corner view of the real-world structure.

6. The method of claim 1, wherein identifying the one or more landmarks in the captured image comprises:
    analyzing the image to determine one or more potentially significant areas in the image.

7. The method of claim 6, wherein the potentially significant areas comprise one or more of:
    areas in which multiple lines intersect; and
    areas depicting structure features.

8. The method of claim 1, wherein generating the virtual 3D model of the real-world structure includes:
    generating, based on the overall peripheral shape, a portion of the virtual 3D model that corresponds to a portion of the real-world structure that is not visible in the plurality of captured images.

9. The method of claim 1, further comprising validating the virtual 3D model by:

performing a comparison between the virtual 3D model and a reference representation of the real-world structure, wherein the reference representation comprises one or more of:
  a digital image, an outline, a wireframe representation, or a second 3D model;
determining a reprojection error based on the comparison; and
determining, based on the reprojection error, whether the first structure category is a correct structure category for the real-world structure.

10. The method of claim 1, wherein determining correlations comprises determining that one or more landmarks of the identified landmarks in a captured image of the plurality of captured images do not correlate to one or more landmarks of the identified landmarks in other captured images of the plurality of captured images.

11. The method of claim 10, further comprising:
responsive to determining that one or more landmarks of the identified landmarks in a captured image of the plurality of captured images do not correlate to one or more landmarks of the identified landmarks in other captured images of the plurality of captured images, generating a user notification to re-capture the image with no correlating landmarks.

12. A system for forming a virtual 3D model of a real-world structure, the system comprising:
one or more processors;
one or more non-transitory computer-readable media storing instructions that, when executed by the one or more processors, cause the one or more processors to perform operations comprising:
  receiving a plurality of captured images of the real-world structure;
  for each captured image of the plurality of captured images, identifying one or more landmarks in the captured image,
  providing metadata for the landmarks, the metadata for each landmark identifying a shape of the landmark and a label for the landmark;
  determining, from a plurality of structure categories, one or more structure categories applicable to the real-world structure based, at least in part, on one or more landmarks of the identified landmarks, wherein each structure category of the plurality of structure categories comprises structure data that defines an overall peripheral shape of structures that belong to the structure category;
  determining correlations between one or more landmarks of the identified landmarks in each captured image of the plurality of captured images, and one or more landmarks of the identified landmarks in each other captured image of the plurality of captured images;
  generating the virtual 3D model of the real-world structure based, at least in part, on:
    the plurality of captured images,
    the correlations between landmarks of the identified landmarks for the plurality of captured images; and
    geometrical constraints for the one or more structure categories applicable to the real-world structure.

13. The system of claim 12, wherein the one or more landmarks comprises one or more lines.

14. The system of claim 12, wherein identifying the one or more landmarks in the captured image comprises:
determining a view of the real-world structure depicted by the captured image;
determining one or more expected landmarks for the view; and
identifying one or more of the expected landmarks within the captured image.

15. The system of claim 12, wherein identifying the one or more landmarks in the captured image comprises:
analyzing the image to determine one or more potentially significant areas in the image, wherein the potentially significant areas comprise one or more of:
  areas in which multiple lines intersect; and
  areas depicting structure features.

16. The system of claim 12, wherein generating the virtual 3D model of the real-world structure includes:
generating, based on the overall peripheral shape, a portion of the virtual 3D model that corresponds to a portion of the real-world structure that is not visible in the plurality of captured images.

17. The system of claim 12, wherein the operations further comprise validating the virtual 3D model by:
performing a comparison between the virtual 3D model and a reference representation of the real-world structure;
wherein the reference representation comprises one or more of:
  a digital image, an outline, a wireframe representation, or a second 3D model;
  determining a reprojection error based on the comparison; and
  determining, based on the reprojection error, whether the first structure category is a correct structure category for the real-world structure.

18. Non-transitory computer storage media storing instructions that when executed by a system of one or more processors, cause the one or more processors to perform operations comprising:
receiving a plurality of captured images of the real-world structure;
for each captured image of the plurality of captured images, identifying one or more landmarks in the captured image,
providing metadata for the landmarks, the metadata for each landmark identifying a shape of the landmark and a label for the landmark;
determining, from a plurality of structure categories, one or more structure categories applicable to the real-world structure based, at least in part, on one or more landmarks of the identified landmarks, wherein each structure category of the plurality of structure categories comprises structure data that defines an overall peripheral shape of structures that belong to the structure category;
determining correlations between one or more landmarks of the identified landmarks in each captured image of the plurality of captured images, and one or more landmarks of the identified landmarks in each other captured image of the plurality of captured images;
generating the virtual 3D model of the real-world structure based, at least in part, on:
  the plurality of captured images,
  the correlations between landmarks of the identified landmarks for the plurality of captured images; and
  geometrical constraints for the one or more structure categories applicable to the real-world structure.

19. The non-transitory computer storage media of claim 18, wherein the one or more landmarks comprises one or more lines.

20. The non-transitory computer storage media of claim 18, wherein identifying the one or more landmarks in the captured image comprises:
- determining a view of the real-world structure depicted by the captured image;
- determining one or more expected landmarks for the view; and
- identifying one or more of the expected landmarks within the captured image.

21. The non-transitory computer storage media of claim 18, wherein identifying the one or more landmarks in the captured image comprises:
- analyzing the image to determine one or more potentially significant areas in the image, wherein the potentially significant areas comprise one or more of:
- areas in which multiple lines intersect; and
- areas depicting structure features.

22. The non-transitory computer storage media of claim 18, wherein generating the virtual 3D model of the real-world structure includes:
- generating, based on the overall peripheral shape, a portion of the virtual 3D model that corresponds to a portion of the real-world structure that is not visible in the plurality of captured images.

23. The non-transitory computer storage media of claim 18, wherein the operations further comprise validating the virtual 3D model by:
- performing a comparison between the virtual 3D model and a reference representation of the real-world structure;
- wherein the reference representation comprises one or more of:
  - a digital image, an outline, a wireframe representation, or a second 3D model;
- determining a reprojection error based on the comparison; and
- determining, based on the reprojection error, whether the first structure category is a correct structure category for the real-world structure.

* * * * *